(12) United States Patent
Chen et al.

(10) Patent No.: US 11,953,717 B1
(45) Date of Patent: Apr. 9, 2024

(54) BACKPLANE ASSEMBLY, BACKLIGHT MODULE AND DISPLAY

(71) Applicant: HKC CORPORATION LIMITED, Shenzhen (CN)

(72) Inventors: Qinglin Chen, Shenzhen (CN); Haijiang Yuan, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 18/446,794

(22) Filed: Aug. 9, 2023

(30) Foreign Application Priority Data

Feb. 27, 2023 (CN) .......................... 202310167645.3

(51) Int. Cl.
*F21V 8/00* (2006.01)
*H05K 5/00* (2006.01)

(52) U.S. Cl.
CPC ......... *G02B 6/0088* (2013.01); *H05K 5/0013* (2013.01)

(58) Field of Classification Search
CPC ........ G02F 1/133613; G02F 1/133608; H05K 5/0013; G02B 6/0088
See application file for complete search history.

(56) References Cited

FOREIGN PATENT DOCUMENTS

| | | | | |
|---|---|---|---|---|
| CN | 101414071 A | | 4/2009 | |
| CN | 102182989 A | * | 9/2011 | ........... G02B 6/0088 |
| CN | 113724580 A | * | 11/2021 | |
| CN | 113724580 A | | 11/2021 | |
| CN | 115327813 A | | 11/2022 | |
| CN | 115407556 A | | 11/2022 | |
| WO | 2021119927 A1 | | 6/2021 | |
| WO | 2022012331 A1 | | 1/2022 | |
| WO | WO-2022012588 A1 | * | 1/2022 | ....... G02F 1/133314 |

OTHER PUBLICATIONS

Innovation Q+ NPL Search (NPL18446794.pdf) (Year: 2023).*
First Office Action issued in counterpart Chinese Patent Application No. 202310167645.3, dated Apr. 28, 2023.
Grant Notification issued in counterpart Chinese Patent Application No. 202310167645.3, dated May 9, 2023.

* cited by examiner

*Primary Examiner* — Anabel Ton
(74) *Attorney, Agent, or Firm* — Westbridge IP LLC

(57) ABSTRACT

Disclosed are a backplane assembly, a backlight module and a display. The backplane assembly includes a bottom backplane, an upper frame, a locking assembly, a bearing body and a first elastic member; the bottom backplane has a bottom wall, and the upper frame is arranged above the bottom backplane; the upper frame has opposite first and second sides; a connecting line from the first side to the second side is parallel to the bottom wall of the bottom backplane, and the first side is provided with a rotating shaft extending toward the bottom backplane.

10 Claims, 15 Drawing Sheets

BACKPLANE ASSEMBLY, BACKLIGHT MODULE AND DISPLAY

CROSS-REFERENCE TO RELATED APPLICATIONS

The present application claims priority to Chinese Patent Application No. 202310167645.3, filed on Feb. 27, 2023, the entire contents of which are incorporated herein by reference.

TECHNICAL FIELD

The present application relates to the technical field of display, in particular to a backplane assembly, a backlight module using the backplane assembly, and a display using the backlight module.

BACKGROUND

With the improvement of people's living standards, more and more display devices have entered people's lives. The display device includes a backlight module and a display panel. The backlight module includes a backplane, a light board, and an optical film, etc. The light board is located under the optical film, and both the light board and the optical film are located in the cavity formed by the backplane. The display panel is bonded to the backplane or the middle frame connected to the backplane by adhesive, and is located above the optical film. However, the traditional backplane is usually a one-piece structure. When the light board is abnormal and needs to be repaired and replaced, it is necessary to disassemble the adhesive with tools first, and then remove the optical film. The operation is cumbersome and will damage the display panel or optical film in severe cases.

SUMMARY

The main purpose of the present application is to provide a backplane assembly, aiming at improving the troublesome problem of repairing and replacing the light board.

In order to achieve the above purpose, the backplane assembly proposed by the present application includes a bottom backplane, an upper frame, a locking assembly and a bearing assembly; the bottom backplane has a bottom wall, and the upper frame is rotatably arranged above the bottom backplane; the upper frame has a first side and a second side opposite to the first side, and a connecting line from the first side to the second side is parallel to the bottom wall of the bottom backplane; the first side is provided with a rotating shaft, and the rotating shaft extends toward the bottom backplane; the locking assembly is movably arranged on the bottom backplane and opposite to the second side; when the locking assembly moves to the first position, the locking assembly is mutually locked with the second side of the upper frame, so that the upper frame and the bottom backplane are relatively fixed; when the locking assembly moves to the second position, the second side of the upper frame can disengage the locking assembly; the bearing assembly includes a bearing body and a first elastic member, and the bearing body is slidably arranged on the bottom backplane and sleeved on the outside the rotating shaft; the first elastic member is arranged on the bottom backplane, and is configured for elastically supporting the bearing body away from one side of the upper frame, so as to drive the bearing body to move toward the upper frame.

In an embodiment, one of the bottom backplane and the upper frame is provided with an embedding groove, and the other one of the bottom backplane and the upper frame is provided with a protrusion; the protrusion is embedded into the embedding groove.

In an embodiment, the bottom backplane is also provided with a side wall connected to the bottom wall, and the side wall is provided with an accommodating groove opening toward the upper frame; the bearing assembly also includes a guide post, and the first elastic member is sleeved outside the guide post; the bearing body, the first elastic member and the guide post are arranged in the accommodating groove.

In an embodiment, the bearing assembly further includes: a second elastic member; one end of the second elastic member is connected to the outer wall of the bearing body, and the other end extends away from the axis of the bearing body; and a limiting post; the limiting post is connected to one end of the second elastic member away from the bearing body; a groove wall of the accommodating groove is provided with a limiting hole, and the limiting post extends into the limiting hole; the limiting hole passes through the side wall of the bottom backplane.

In an embodiment, the bearing assembly further includes a rotation stopper, and the rotation stopper is protruded on an outer side wall of the bearing body; the groove wall of the accommodating groove is correspondingly provided with an avoidance groove, and the rotation stopper is inserted into the avoidance groove.

In an embodiment, the locking assembly includes: a fixing post fixedly installed on the bottom backplane; and a sleeve; the sleeve comprises a cylinder body and a limiting block, and the cylinder body is rotatably sleeved outside the fixing post; the limiting block is protruded on an outer side wall of the cylinder body. The upper frame is provided with a limiting cavity, and a limiting plate is provided on a side of the limiting cavity close to the bottom backplane; the limiting block abuts against a side of the limiting plate away from the bottom backplane, and the limiting plate is provided with a piercing opening and an avoidance opening communicating with each other; the cylinder body is passed through the piercing opening; the avoidance opening is configured for fully exposing the limiting block when the sleeve is rotated to the second position.

In an embodiment, the locking assembly further includes a first torsion spring, and the first torsion spring is sleeved outside the fixing post; one end of the first torsion spring is connected to the fixing post, and the other end of the first torsion spring is connected to the sleeve.

In an embodiment, the bottom backplane is also provided with a side wall connected to the bottom wall, and the side wall is provided with a mounting groove and an avoidance hole; the mounting groove is provided with an opening facing the upper frame, and the fixing post, the sleeve and the limiting block are all located in the mounting groove; one end of the avoidance hole communicates with the mounting groove, and the other end of the avoidance hole passes through the side wall in order to communicate with the outside world; a drive block is protruded from the outer side wall of the cylinder body, and the drive block is exposed through the avoidance hole.

The present application also provides a backlight module, including: a light board, an optical film, and the backplane assembly; the bottom backplane is formed with a receiving cavity, and the light board and the optical film are arranged in the receiving cavity.

The present application also provides a display, including: a display panel and the backlight module; the display panel is arranged on a side of the upper frame away from the bottom backplane.

The technical solution of the present application adopts a rotatable connection between the bottom backplane and the upper frame in the backplane assembly, so that when the upper frame rotates relative to the bottom backplane, the upper frame can be at least partially separated from the bottom backplane, thereby facilitating to expose the light board on the bottom backplane or the optical film on the side of the light board away from the bottom wall of the bottom backplane, so as to avoid the risk of damage to the optical film or display by using tools to remove the adhesive glue under the display panel. Further, by setting a rotating shaft extending toward the bottom backplane on the first side of the upper frame, the rotating shaft is perpendicular to the bottom wall of the bottom backplane, so that the upper frame rotates in a plane parallel to the bottom wall of the bottom backplane, thereby avoiding the risk that the display panel may easily fall from the upper frame when the upper frame is turned upward. In addition, by providing the locking assembly, when the upper frame and the bottom backplane need to be fixed, the locking effect of the upper frame and the bottom backplane can be realized by moving the locking assembly to the first position. In addition, when the locking assembly moves to the second position, the upper frame can be released from the locked state of the locking assembly, so that it can be lifted away from the bottom backplane; the upper frame can move relative to the bottom backplane after being lifted a certain distance, so that the upper frame moves to a position where the light board can be prevented from being disassembled from the bottom backplane. On the one hand, the setting of the locking assembly facilitates the locking effect of the upper frame and the bottom backplane, and on the other hand, it is also convenient for the user to unlock the upper frame and the bottom backplane, which is convenient for the user to operate and avoids using tools such as screwdrivers to conduct the unlocked or locked operation of the upper frame and the bottom backplane. By arranging the bearing assembly, the bearing body of the bearing assembly is slidably arranged on the bottom backplane and sleeved outside the rotating shaft, which can reduce the friction force received by the rotating shaft when it rotates, and reduce the risk of the rotating shaft being worn. By arranging the first elastic member at the bottom of the bearing body, the first elastic member drives the bearing body to move towards the upper frame, then when the upper frame and the bottom backplane are separated from each other through the locking assembly, the first elastic member can immediately and automatically lift the bearing body and the upper frame upwards, so that the upper frame is not easy to interfere with the bottom backplane when it rotates relative to the bottom backplane.

BRIEF DESCRIPTION OF THE DRAWINGS

In order to more clearly illustrate the technical solutions in the embodiments of the present application or the related art, the following will briefly introduce the drawings that need to be used in the description of the embodiments or the related art. Obviously, the accompanying drawings in the following description are only some embodiments of the present application. For those skilled in the art, other drawings can also be obtained according to the structures shown in these drawings without creative effort.

Figure 1:
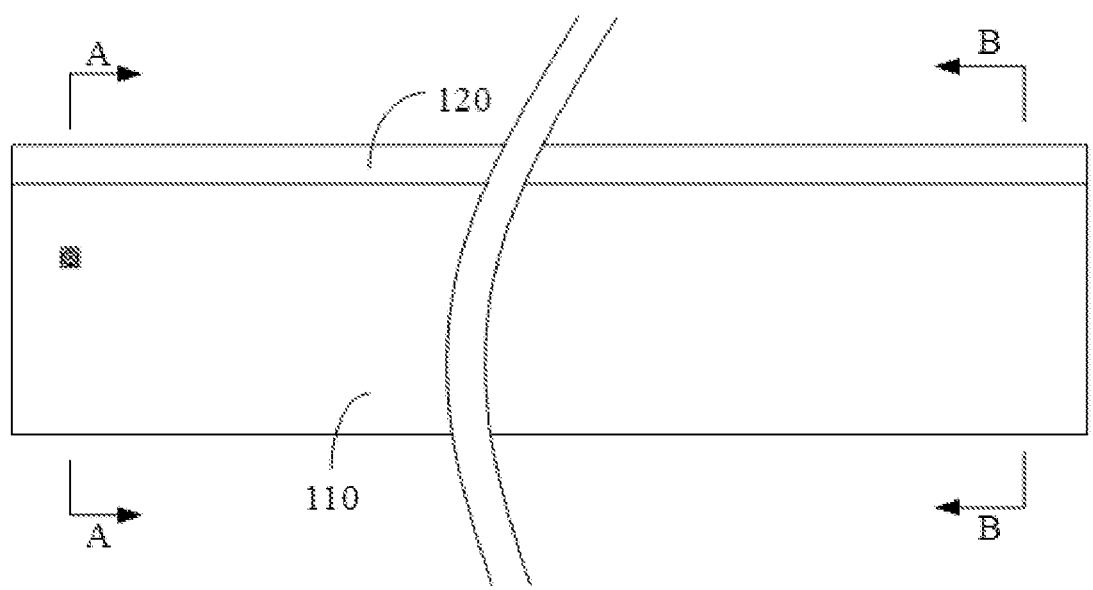
FIG. 1 is a schematic view of a partial structure on the back of a backplane assembly according to an embodiment of the present application.

The realization of the purpose of the present application, functional characteristics and advantages will be further described with reference to the accompanying drawings in conjunction with the embodiments.

DETAILED DESCRIPTION OF THE EMBODIMENTS

The following will clearly and completely describe the technical solutions in the embodiments of the present application with reference to the accompanying drawings in the embodiments of the present application. Obviously, the described embodiments are only part of the embodiments of the present application, but not all of them. Based on the embodiments of the present application, all other embodiments obtained by those skilled in the art without creative efforts fall within the protection scope of the present application.

It should be noted that if there are directional indications (such as up, down, left, right, front, back . . . ) in the embodiment of the present application, the directional indications are only used to explain the relative positional relationship and movement of each component in a certain posture (as shown in the accompanying drawings). If the specific posture changes, the directional indication will also change accordingly.

In addition, if there are descriptions involving "first", "second" and so on in the embodiments of the present application, the descriptions of "first", "second" and so on are only for descriptive purposes, and should not be interpreted as indicating or implying its relative importance or implicitly indicates the number of technical features indicated. Thus, the features defined as "first" and "second" may explicitly or implicitly include at least one of these features. In addition, the technical solutions of the various embodiments can be combined with each other, but it must be based on the realization of those skilled in the art. When the combination of technical solutions is contradictory or cannot be realized, it should be considered that the combination of technical solutions does not exist, and not within the protection scope required by the present application.

First Embodiment

The present application provides a backplane assembly 100.

In the embodiment of the present application, referring to FIG. 1 to FIG. 13, the backplane assembly 100 includes a bottom backplane 110, an upper frame 120, a locking assembly 140 and a bearing assembly 150; the bottom backplane 110 has a bottom wall 110a, and the upper frame 120 is arranged above the bottom backplane 110; the upper frame 120 is provided with a first side 120a and a second side 120b opposite to the first side 120a, and a connecting line from the first side 120a to the second side 120b is parallel to the bottom wall 110a of the bottom backplane 110; the first side 120a is provided with a rotating shaft 123, and the rotating shaft 123 extends toward the bottom backplane 110; the locking assembly 140 is movably arranged on the bottom backplane 110; the locking assembly 140 is opposite to the second side 120b; when the locking assembly 140 moves to the first position, the locking assembly 140 is locked with the second side 120b of the upper frame 120, so that the upper frame 120 is relatively fixed to the bottom backplane 110; when the locking assembly 140 moves to the second position, the second side 120b of the upper frame 120 can disengage the locking assembly 140. The bearing assembly 150 includes a bearing body 151 and a first elastic member, and the bearing body 151 is slidably arranged on the bottom backplane 110 and sleeved outside the rotating shaft 123. The first elastic member 152 is disposed on the bottom backplane, and is configured for elastically supporting the side of the bearing body 151 away from the upper frame 120 to drive the bearing body 151 to move toward the upper frame 120.

It should be noted that the "up" and "down" in the technical solutions of the present application are based on the installation state, that is, the bottom backplane 110 of the backplane assembly 100 is arranged on the side close to the ground during installation, and the upper frame 120 is located on the side of the bottom backplane 110 away from the ground; that is, the thickness direction or the front-to-back direction of the display device in normal use. By rotatably connecting the bottom backplane 110 and the upper frame 120 of the backplane assembly 100, when the upper frame 120 rotates relative to the bottom backplane 110, the upper frame 120 can be at least partially separated from the bottom backplane 110, thereby making the backplane assembly 100 form two parts that can move relatively.

It can be understood that the light board 200 is usually arranged on the bottom backplane 110 of the backplane assembly 100, and the display panel 400 can be arranged on the side of the upper frame 120 away from the bottom backplane 110. When the upper frame 120 rotates relative to the bottom backplane 110, the upper frame 120 can be detached from the bottom backplane 110, so that the optical film 300 can be exposed or the light board 200 can be directly exposed, thereby avoiding the risk of damage to the optical film 300 or the display panel 400 by using tools to remove the adhesive glue below the display panel 400.

It should be noted that, when the optical film 300 is also installed in the space enclosed by the bottom backplane 110, by rotating the upper frame 120 so that the upper frame 120 and the bottom backplane 110 are misaligned, the optical film 300 is first exposed; at this time, the user only needs to directly take down the optical film 300 to repair the light board 200; when the optical film 300 is installed in the upper frame 120, after the upper frame 120 and the bottom backplane 110 are misaligned with each other by rotating the upper frame 120, the light board 200 can be directly exposed, and at this time, the light board 200 can be directly inspected, disassembled and with other operations.

In addition, when the upper frame 120 rotates relative to the bottom backplane 110, since the rotating shaft 123 provided on the upper frame 120 extends toward the bottom backplane 110, that is, the rotating shaft 123 is perpendicular to the bottom wall 110a of the bottom backplane 110, so that the upper frame 120 rotates in a plane parallel to the bottom wall 110a of the bottom backplane 110 when the upper frame 120 rotates relative to the bottom backplane 110. At the same time, since the locking assembly 140 is arranged on the bottom backplane 110 at a position opposite to the second side 120b of the upper frame 120, when the locking assembly 140 unlocks the upper frame 120, the upper frame 120 can rotate around the rotating shaft 123, so that the display panel 400 disposed on the upper frame 120 and the light board 200 disposed on the bottom backplane 110 are separated from each other, thereby achieving the effect of exposing the light board 200 or the optical film 300.

Specifically, the bottom backplane 110 may include a bottom wall 110a and a side wall 110b, and the light board 200 may be provided on the bottom wall 110a or on the side wall 110b. When the light board 200 is installed on the bottom wall 110a, the light board 200 may include a plurality of lamp beads arranged in an array; especially when a certain lamp bead of the light board 200 does not light up and needs maintenance, the light board 200 can be exposed only by disassembling the bottom backplane 110 from the upper frame 120, and then the effect of repairing the unlit lamp beads can be achieved, without sequentially removing the display panel 400 and the optical film 300 in order to expose the light board 200. Of course, the bottom backplane 110 may also only include the bottom wall 110a without the side wall 110b. The display panel 400 is installed on the side of the upper frame 120 away from the bottom backplane 110, and the optical film 300 can also be installed on the side facing the bottom backplane 110, or the optical film 300 can also be arranged on the side of the bottom backplane 110 close to the upper frame 120. The upper frame 120 has an opening, so that the optical film 300 can process the light emitted by the light board 200 and irradiate it onto the display panel 400, so that the display panel 400 can display images.

During normal use, in order to ensure the stability of the connection between the upper frame 120 and the bottom backplane 110, the upper frame 120 and the bottom backplane 110 are locked and fixed by the locking assembly 140. The locking assembly 140 in the present application means that at least part of the assembly can be locked and fixed with the upper frame 120 when it moves to the first position, and can unlock the upper frame 120 when it moves to the second position, so that the upper frame 120 can be disassembled from the locking assembly 140.

Specifically, the locking assembly 140 can be rotatably connected with the bottom backplane 110. More specifically, the locking assembly 140 includes a rotating body disposed on the bottom backplane 110 and capable of rotating relative to the bottom backplane 110, and an elastic locking block disposed on a side wall of the rotating body. The upper frame 120 is provided with an adapting groove adapted to the rotating body; the wall of the adapting groove is protruded with a protrusion, and the side of the protrusion facing the rotating body is provided with a locking hole. When the user drives the rotating body to rotate to the first position, the elastic block is stuck into the locking hole of the protrusion; when the user drives the rotating body to rotate again, the elastic block can come out of the locking hole due to its elasticity until the rotating body rotates to the second position, the elastic block and the protrusion on the upper frame 120 are misaligned, so that the upper frame 120 is unlocked, and the upper frame 120 can be lifted away from the bottom backplane 110. The upper frame 120 can be rotated relative to the bottom backplane 110 after being lifted for a certain distance, so that the upper frame 120 can rotate to a position where the light board 200 can be prevented from being disassembled from the bottom backplane 110.

Alternatively, the locking assembly 140 includes a rotating body, an elastic member and a limiting member. The rotating body can be in a plane parallel to the bottom wall 110a of the bottom backplane 110, and is arranged on the bottom backplane 110. One end of the elastic member is arranged on the side wall of the rotating body, and the other end extends radially outward of the rotating body and is connected to the limiting member. The upper frame 120 is provided with an adapting groove adapted to the rotating body, and the wall of the adapting groove is provided with a limiting hole. When the user drives the rotating body to rotate to the first position, both the elastic member and the limiting member are opposite to the limiting hole. At this time, the limiting member is snapped into the limiting hole under the action of the elastic member, so that the locking assembly 140 will lock the upper frame 120 with the bottom backplane 110, thereby preventing the upper frame 120 from moving relative to the bottom backplane 110. When the user continues to forcefully drive the rotating body to rotate, the limiting member can escape from the limiting hole, so that the upper frame 120 is out of the locked state of the locking assembly 140; the upper frame 120 can be lifted away from the bottom backplane 110, and after lifted for a certain distance, the upper frame 120 can rotate around the axis of the rotating shaft 123 to achieve the effect of rotating relative to the bottom backplane 110, thereby making the upper frame 120 rotate to a position where the light board 200 can be prevented from being disassembled from the bottom backplane 110.

Alternatively, the locking assembly 140 may also be slidably connected to the bottom backplane 110. More specifically, the projections of the bottom backplane 110 and the upper frame 120 in the plane perpendicular to the bottom wall 110a are at least partially coincident. Bolts are provided at the positions where the projections of the bottom backplane 110 and the upper frame 120 coincide in a plane perpendicular to the bottom wall, and the bolts are slidably arranged on bottom backplane 110 and extend along a direction parallel to bottom wall 110a. When it is in the first position, the bolt can be inserted into the upper frame 120 in a direction parallel to the bottom wall 110a, so as to realize the locked state of the bottom backplane 110 and the upper frame 120; when the user drives the bolt to slide relative to the bottom backplane 110 to the second position, the bolt is separated from the upper frame 120 to achieve the effect that the upper frame 120 can be lifted away from the bottom backplane 110. Then, the upper frame 120 is rotated around the rotating shaft 123 so as to be misaligned with the bottom backplane 110 and at least partly separated from the bottom backplane 110, so that the user can remove the optical film 300 and the light board 200 for easy replacement and maintenance of the light board 200.

It can be understood that the bearing body 151 in the bearing assembly 150 generally includes an inner ring, an outer ring and a rolling element disposed between the inner ring and the outer ring. The inner ring can rotate relative to the outer ring. By installing the bearing assembly 150 in the accommodating groove 113 of the bottom backplane 110, and the bearing assembly 150 sleeved outside the rotating shaft 123, when the upper frame 120 rotates relative to the bottom backplane 110, the rotating shaft 123 of the upper frame 120 and the inner ring of the bearing assembly 150 rotate together relative to the outer ring, thereby reducing the risk of wear of the upper frame 120.

In addition, by arranging rolling bodies between the inner ring and the outer ring, the frictional force received by the upper frame 120 can also be reduced when the upper frame 120 rotates relative to the bottom backplane 110. By arranging the bearing body 151, the bearing body 151 is sleeved outside the rotating shaft 123, which can reduce the frictional force received by the upper frame 120 when rotating, and also reduce the risk of damage to the upper frame 120 when rotating. In addition, by elastically supporting the side of the bearing body 151 away from the upper frame 120 by the first elastic member 152, after the second side of the upper frame 120 is unlocked by the locking assembly 140, it can automatically bounce upwards under the rebound action of the first elastic member 152, thereby reducing the action of driving the upper frame 120 to rotate after the user drives the upper frame 120 upwards to lift away from the bottom backplane 110.

According to a rotatable connection between the bottom backplane 110 and the upper frame 120 in the backplane assembly 100 adopted by the technical solution of the present application, when the upper frame 120 rotates relative to the bottom backplane 110, the upper frame 120 can be at least partially detached from the bottom, which is convenient for exposing the light board 200 provided on the bottom backplane 110 or the optical film 300 provided on the side of the light board 200 away from the bottom wall 110a of the bottom backplane 110. Therefore, the risk of damage to the optical film 300 or the display panel 400 caused by removing the adhesive glue under the display panel 400 by using a tool is avoided. Further, by setting the rotating shaft 123 extending toward the bottom backplane 110 on the first side 120a of the upper frame 120, the rotating shaft 123 is perpendicular to the bottom wall 110a of the bottom backplane 110, so that the upper frame 120 can be rotated in a plane parallel to the bottom wall 110 a of the bottom backplane 110, thereby avoiding the risk that the display panel 400 will easily fall from the upper frame 120 when the upper frame 120 is turned upwards.

In addition, by providing the locking assembly 140, when the upper frame 120 and the bottom backplane 110 need to be fixed, the locking effect of the upper frame 120 and the bottom backplane 110 can be realized when the locking assembly 140 moves to the first position. In addition, when the locking assembly 140 moves to the second position, the upper frame 120 can be released from the locked state of the locking assembly 140, so that it can be lifted away from the bottom backplane 110; The upper frame 120 can move relative to the bottom backplane 110 after being lifted for a certain distance, so that the upper frame 120 can move to a position where the light board 200 can be prevented from being disassembled from the bottom backplane 110.

On the one hand, the setting of the locking assembly 140 is convenient to realize the locking effect of the upper frame 120 and the bottom backplane 110; on the other hand, it is also convenient for the user to unlock the upper frame 120 and the bottom backplane 110, which is convenient for the user to operate and avoids unlocking or locking the upper frame 120 and the bottom backplane 110 by tools such as a screwdriver. By arranging the bearing assembly 150, the bearing body 151 of the bearing assembly 150 is slidably arranged on the bottom backplane 110 and sleeved outside the rotating shaft 123, so that the frictional force received by the rotating shaft 123 when rotating can be reduced, and the risk of the rotating shaft 123 being worn is reduced. By setting the first elastic member 152 at the bottom of the bearing body 151, the first elastic member 152 drives the bearing body 151 to move toward the upper frame 120, then when the upper frame 120 and the bottom backplane 110 are separated from each other by the locking assembly 140, the first elastic member 152 can immediately and automatically lift the bearing body 151 and the upper frame 120 upwards, so that the upper frame 120 is less likely to interfere with the bottom backplane 110 when it rotates relative to the bottom backplane 110.

Figure 2:
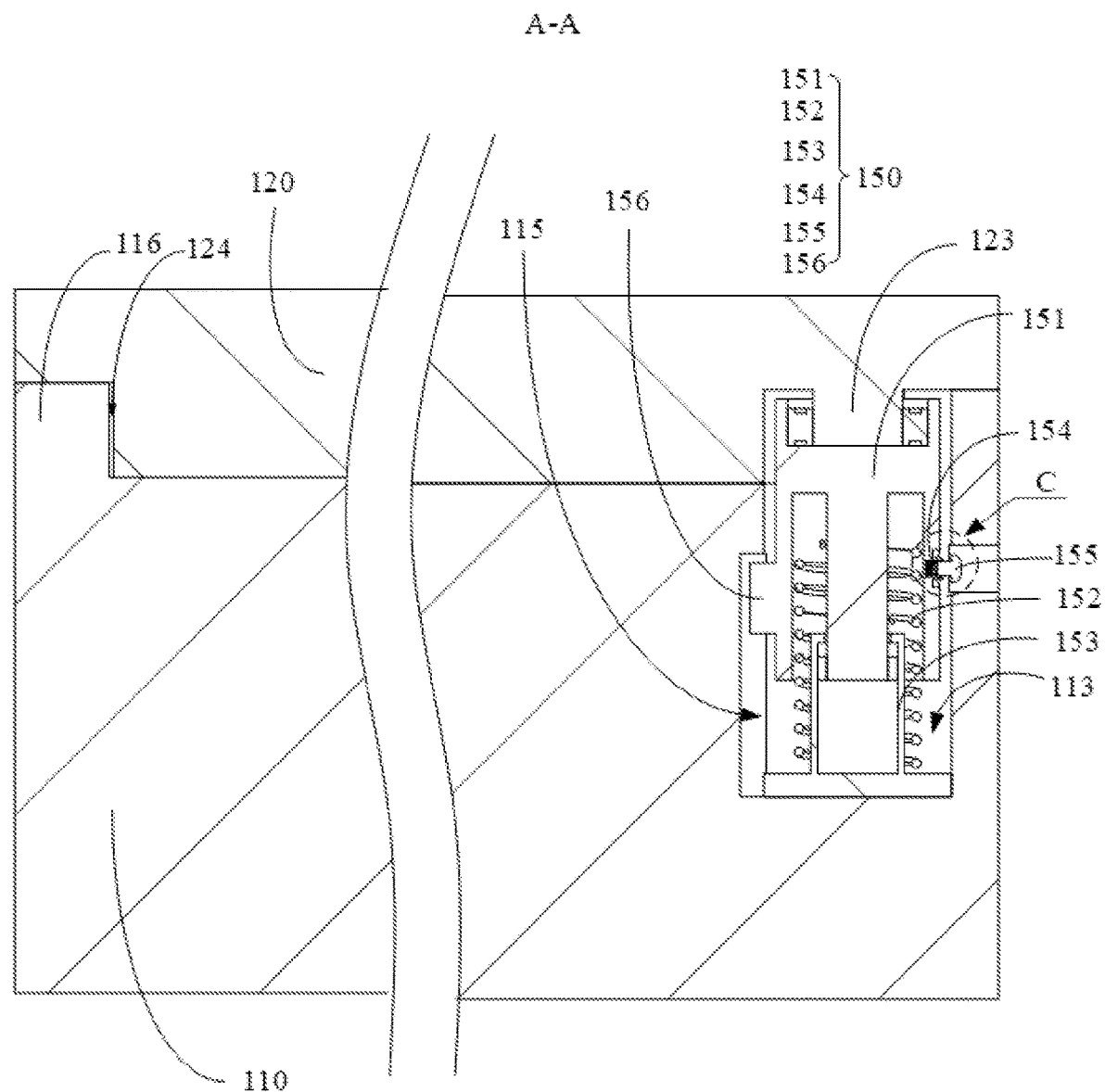
FIG. 2 is a sectional view of A-A place in FIG. 1.

In one example, as shown in FIG. 2, one of the bottom backplane 110 and the upper frame 120 is provided with an embedding groove 124, and the other is provided with a raised portion 116 which is embedded in the embedding groove 124.

Specifically, the bottom backplane 110 is provided with an embedding groove 124, and the upper frame 120 is provided with a raised portion 116. Alternatively, the bottom backplane 110 is provided with a raised portion 116, and the upper frame 120 is provided with an embedding groove 124. Alternatively, the bottom backplane 110 and the upper frame 120 are fitted together through a stepped structure that fits into each other. Such arrangement makes the contact surface between the bottom backplane 110 and the upper frame 120 a bent surface, so that on the one hand, the risk of light leakage can be reduced, and on the other hand, the risk of foreign matter entering the backplane assembly 100 and affecting the light output effect can be reduced. In addition, in combination with the above-mentioned embodiment in which the bearing assembly 150 includes the first elastic member 152, in this example, the upper frame 120, that is, the rotating shaft 123 on the upper frame 120, can be lifted upward by a certain distance under the action of the first elastic member 152, so that the raised portion 116 can be disengaged from the embedding groove 124, and the user can rotate the upper frame 120 without being interfered by the bottom backplane 110.

Figure 3:
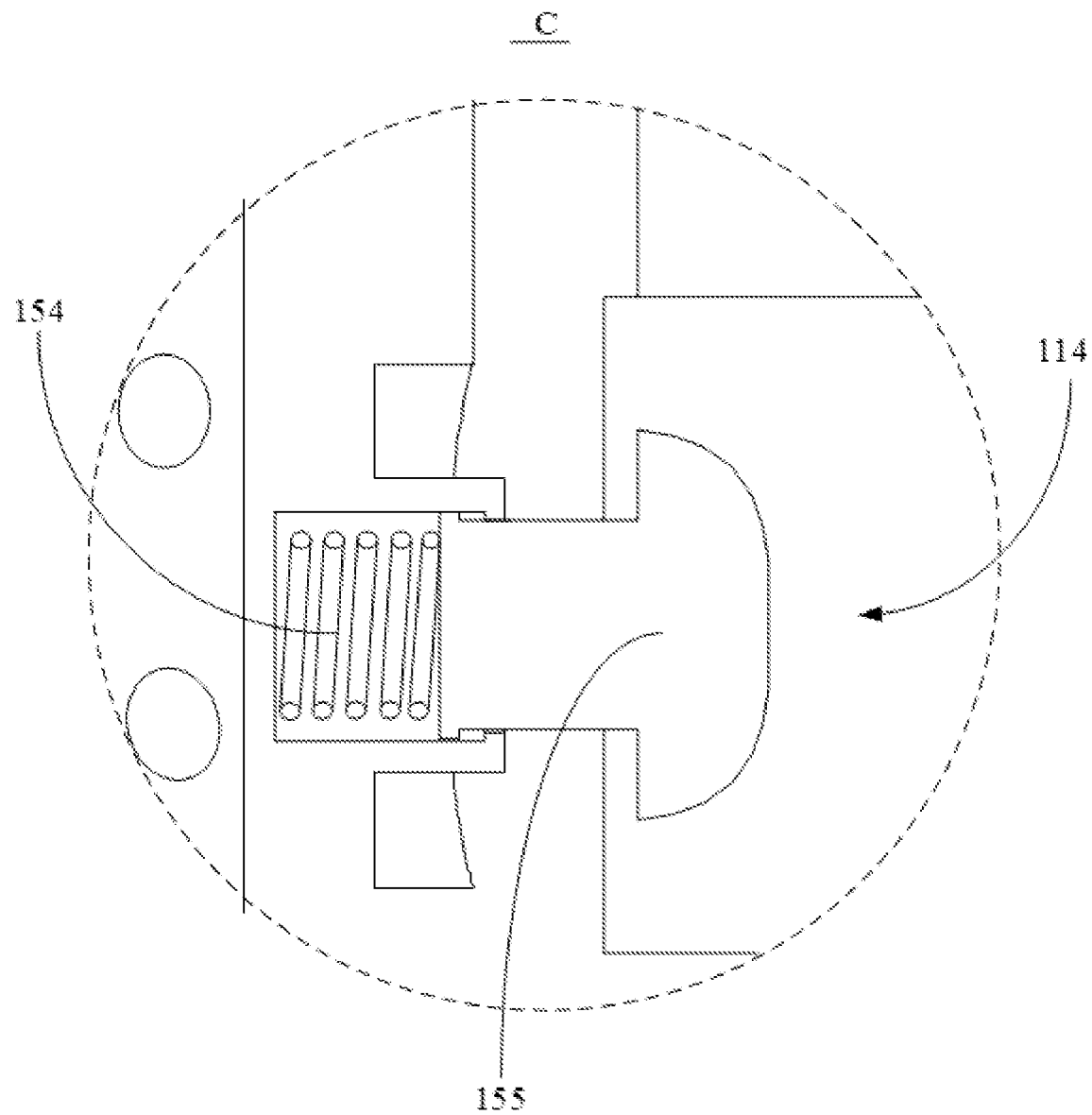
FIG. 3 is a partial enlarged view of C place in FIG. 2.

As an example, please referring to FIG. 1 to FIG. 3, the bottom backplane 110 is also provided with a side wall 110b connected to the bottom wall 110a, and the side wall 110b is provided with an accommodating groove 113 opening toward the upper frame 120. The bearing assembly 150 also includes the guide post 153, and the bearing body 151, the first elastic member 152 and the guide post 153 are all disposed in the accommodating groove 113.

By disposing the bearing assembly 150 in the accommodating groove 113 of the bottom backplane 110, the bearing assembly 150 is protected and the occupied space is reduced in the up and down direction. By setting the guide post 153 in the accommodating groove 113, the first elastic member 152 is sleeved outside the guide post 153, so that the guide post 153 has a better guiding effect in the elastic deformation direction of the first elastic member 152, thereby reducing the risk of the failure of the first elastic member 152 due to toppling left and right.

Further, please referring to FIG. 1 to FIG. 3, the bearing assembly 150 also includes a second elastic member 154 and a limiting post 155. One end of the second elastic member 154 is connected to the outer side wall of the bearing body 151, and the other end extends away from the axis of the bearing body 151. The limiting post 155 is connected to the end of the second elastic member 154 away from the bearing body 151, and the groove wall of the accommodating groove 113 is provided with a limiting hole 114. The limiting post 155 extends into the limiting hole 114, and the limiting hole 114 passes through the side wall 110b of the bottom backplane 110.

By disposing the second elastic member 154 on the outer wall of the bearing body 151, that is, the second elastic member 154 is arranged on the outer wall of the outer ring of the bearing body 151, and the second elastic member 154 is away from one end of the bearing body 151, the groove wall of the accommodating groove 113 is provided with a limiting hole 114 for the limiting post 155 to extend into, so that the limiting post 155 can play a better position limit effect on the installation of the bearing assembly 150, and prevent the bearing assembly 150 from bouncing out of the accommodating groove 113 under the action of the first elastic member 152. In addition, by providing the second elastic member 154, the user can also compress the second elastic member 154 during the process of installing the bearing assembly 150 in the accommodating groove 113, so that the limiting post 155 enters the accommodating groove 113, and slides along the groove wall of the accommodating groove 113 toward the bottom wall 110a of the bottom backplane 110. When the limiting post 155 moves with the bearing body 151 to the notch of the limiting hole 114, the limiting post 155 extends into the limiting hole 114 under the rebound action of the second elastic member 154, thereby realizing the effect of automatic locking of the bearing assembly 150, and avoiding setting a complicated fastening structure to limit the bearing assembly 150 inside the accommodating groove 113 of the bottom backplane 110.

By passing the limiting hole 114 through the side wall 110b of the bottom backplane 110, the limiting post 155 can be exposed from the limiting hole 114, which is convenient for the user to extend into the limiting hole 114 with a slender tool to squeeze the limiting post 155. The limiting post 155 squeezes the second elastic member 154, the second elastic member 154 is compressed and the limiting post 155 moves to disengage from the limiting hole 114 and enters the accommodating groove 113, and then the tool is released. The second elastic member 154, the limiting post 155 and the bearing body 151 all move upward under the elastic force of the first elastic member 152, thereby automatically driving the upper frame 120 to move away from the bottom backplane 110, that is, to move upward, so as to further avoid interference phenomenon when the upper frame 120 rotates relative to the bottom backplane 110.

Further, referring to FIG. 1 to FIG. 3, the bearing assembly 150 further includes a rotation stopper 156 protruding from the outer wall of the bearing body 151. The groove wall of the accommodating groove 113 is correspondingly provided with an avoidance groove 115, and the rotation stopper 156 is inserted into the avoidance groove 115.

By protruding the rotation stopper 156 on the outer side wall of the bearing body 151, the groove wall of the accommodating groove 113 is correspondingly provided with an avoidance groove 115, and the rotation stopper 156 is inserted into the avoidance groove 115, so that the groove wall of the avoidance groove 115 has a better anti-rotation effect to the rotation stopper 156. Therefore, the risk of torsional deformation of the first elastic member 152 caused by the outer wall of the bearing body 151 is reduced as the upper frame 120 and the rotating shaft 123 rotate.

Specifically, the protrusion height of the rotation stopper 156 is not less than 0.5 mm and not greater than 1 mm. For example, the protrusion height of the rotation stopper 156 may be 0.6 mm, 0.7 mm, 0.8 mm, 0.9 mm or 1 mm. It should be noted that the protrusion height direction of the rotation stopper 156 is radially outward direction of the bearing. By setting the protrusion height dimension of the rotation stopper 156 to not less than 0.5 mm, it can be ensured that the rotation stopper 156 can be effectively inserted into the avoidance groove 115, thereby effectively being limited by the groove wall of the avoidance groove 115, and playing a better role of preventing the bearing body 151 from rotating. By setting the protrusion height dimension of the rotation stopper 156 to be not greater than 1 mm, it is convenient for the bearing body 151 and the rotation stopper 156 to be installed in the accommodating groove 113.

Further, in order to facilitate the operation of installing the bearing body 151 and the rotation stopper 156 in the accommodating groove 113, the side of the rotation stopper 156 away from the upper frame 120 may be provided with a guide slope, so as to prevent the rotation stopper 156 from being stuck on the inner wall of the notch of the accommodating groove 113. Or the rotation stopper 156 can be an elastic rubber block. When the rotation stopper 156 is installed from the notch of the accommodating groove 113, the groove wall of the accommodating groove 113 can press the rotation stopper 156, so that the rotation stopper 156 is elastically deformed, so as to ensure that the rotation stopper 156 can be inserted into the accommodating groove 113 together with the bearing body 151.

As an example, please referring to FIG. 1, FIG. 4 to FIG. 13, the locking assembly 140 includes a fixing post 141 and a sleeve 142, and the fixing post 141 is fixedly installed on the bottom backplane 110; the sleeve 142 includes a cylinder body 1421 and a limiting block 1422, and the cylinder body 1421 is rotatably sleeved outside the fixing post 141; the limiting block 1422 protrudes from the outer wall of the cylinder body 1421; the upper frame 120 is provided with a limiting cavity 121, and the side of the limiting cavity 121 close to the bottom backplane 110 is provided with a limiting plate 122; the limiting block 1422 abuts against the side of the limiting plate 122 away from the bottom backplane 110, and the limiting plate 122 is provided with a piercing opening 122a and an avoidance opening 122b which communicate with each other; the cylinder body 1421 is pierced with the piercing opening 122a; the avoidance opening 122b is configured for fully exposing the limiting block 1422 when the sleeve 142 is rotated to the second position.

The fixing post 141 is fixedly installed on the bottom backplane 110 so as to facilitate the sleeve 142 to be sleeved. The fixing post 141 may include a base plate and a cylinder protruding from the base plate, and the sleeve 142 is sleeved outside the cylinder so that the sleeve 142 can rotate relative to the fixing post 141. Specifically, the sleeve 142 includes a cylinder body 1421 and a stopper 1422 protruding from the outer wall of the cylinder body 1421; by opening the limiting cavity 121 in the upper frame 120, it is convenient for the cylinder body 1421 and the limiting block 1422 to rotate in the limiting cavity 121, thereby providing a rotation space for the rotation of the cylinder body 1421 and the limiting block 1422; by setting the limiting plate 122 on the side of the limiting cavity 121 close to the bottom backplane 110, the limiting block 1422 abuts against the side of the limiting plate 122 away from the bottom backplane 110, so that the limiting plate 122 has a better limit effect on the sleeve 142, and prevents the upper frame 120 and the sleeve 142 of the locking assembly 140 from easily detachment, thereby ensuring a good fixing effect between the upper frame 120 and the bottom backplane 110.

Further, the limiting plate 122 is provided with a piercing opening 122a for the cylinder body 1421 to pass through, so that the limiting plate 122 can avoid the cylinder body 1421 and avoid interference between the limiting plate 122 and the cylinder body 1421. In addition, by opening the avoidance opening 122b on the limiting plate 122, the avoidance opening 122b is used to fully expose the limiting block 1422 when the sleeve 142 is rotated to the second position, so that when the sleeve 142 is rotated to the second position, the limiting block 1422 can release the mutual limiting effect with the limiting plate 122 by passing through the avoidance opening 122b. In specific operation, when the sleeve 142 is rotated to the first position, the limiting block 1422 can be located on the side of the limiting plate 122 away from the fixing post 141, so that the upper frame 120 and the bottom backplane 110 are limited in the up and down direction, thereby preventing the upper frame 120 from detaching from the bottom backplane 110 upwards. In addition, when the sleeve 142 continues to be rotated so that the sleeve 142 is rotated to the second position, the limiting block 1422 of the sleeve 142 is facing the avoidance opening 122b. At this time, the user only needs to move the upper frame 120 away from the bottom backplane 110, so that the limiting block 1422 of the sleeve 142 can pass through the avoidance opening 122b, so as to break away from the mutual limit with the limiting plate 122. In this way, the upper frame 120 can be separated from the locking assembly 140 and the bottom backplane 110, and the upper frame 120 and the bottom backplane 110 are separated from each other, so that the backplane assembly 100 can be split into two parts, thereby exposing the optical film 300 or the light board 200, which is convenient for maintenance or replacement of the light board 200.

Figure 4:
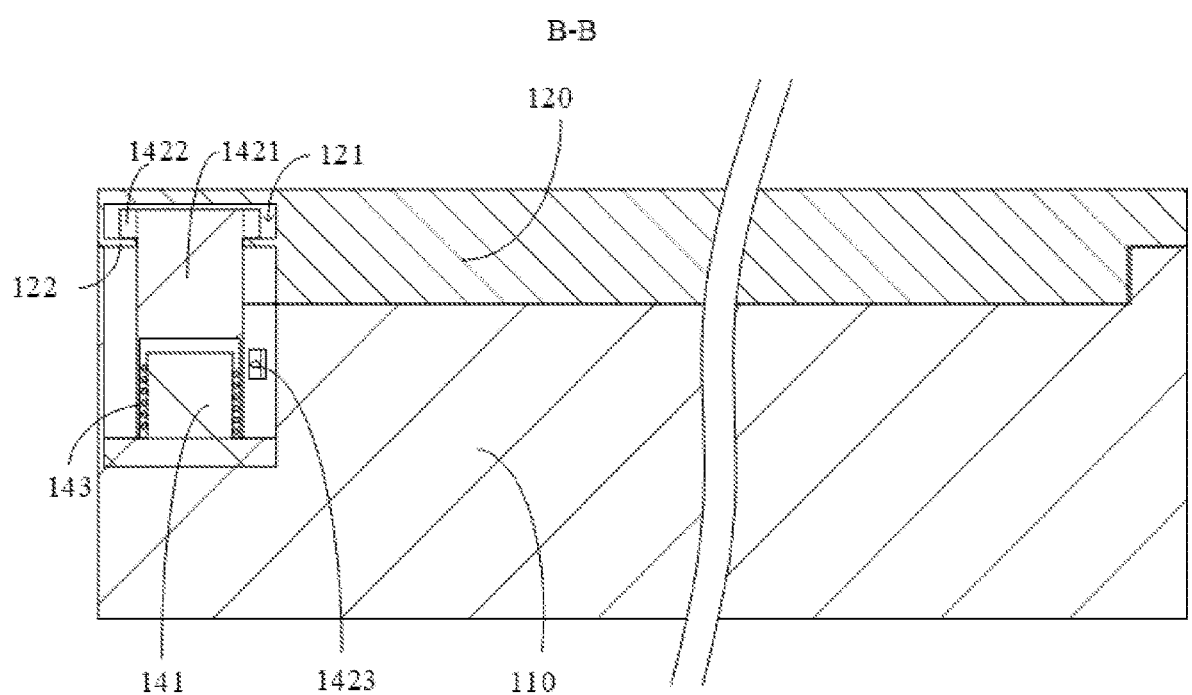
FIG. 4 is a sectional view of B-B place in FIG. 1.
Figure 5:
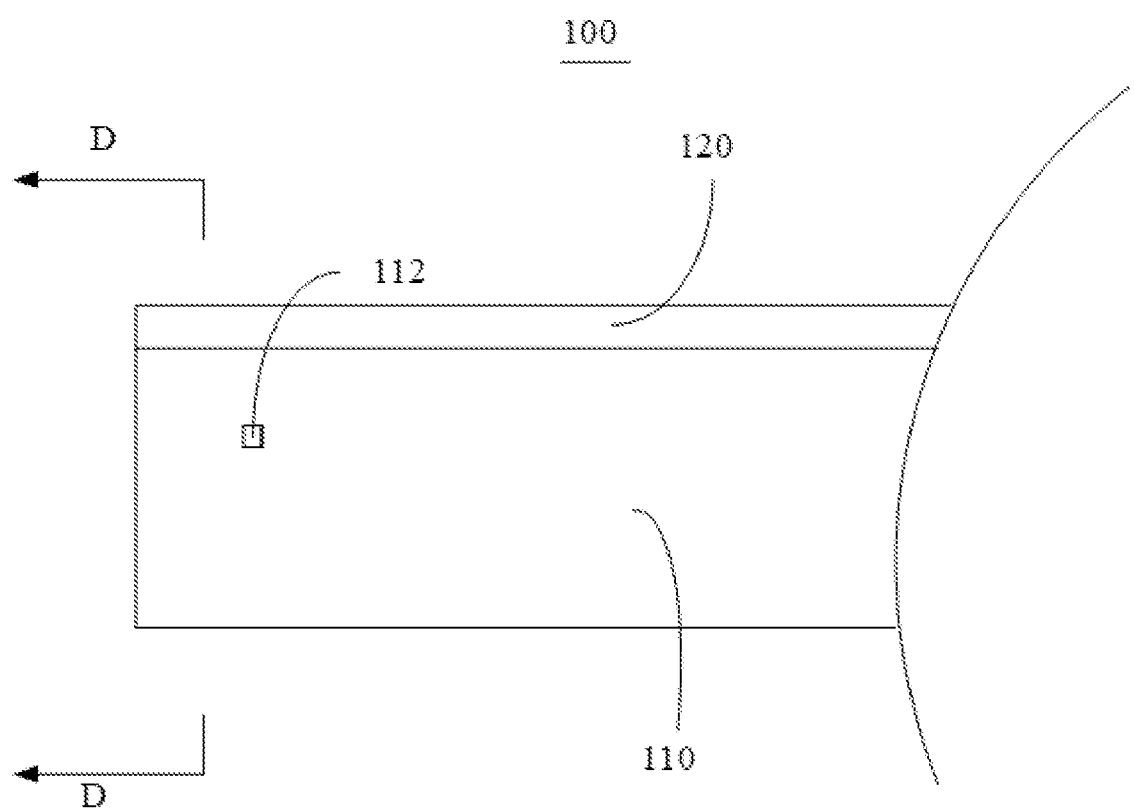
FIG. 5 is a schematic view of a front partial structure of a backplane assembly according to a first embodiment of the present application.
Figure 6:
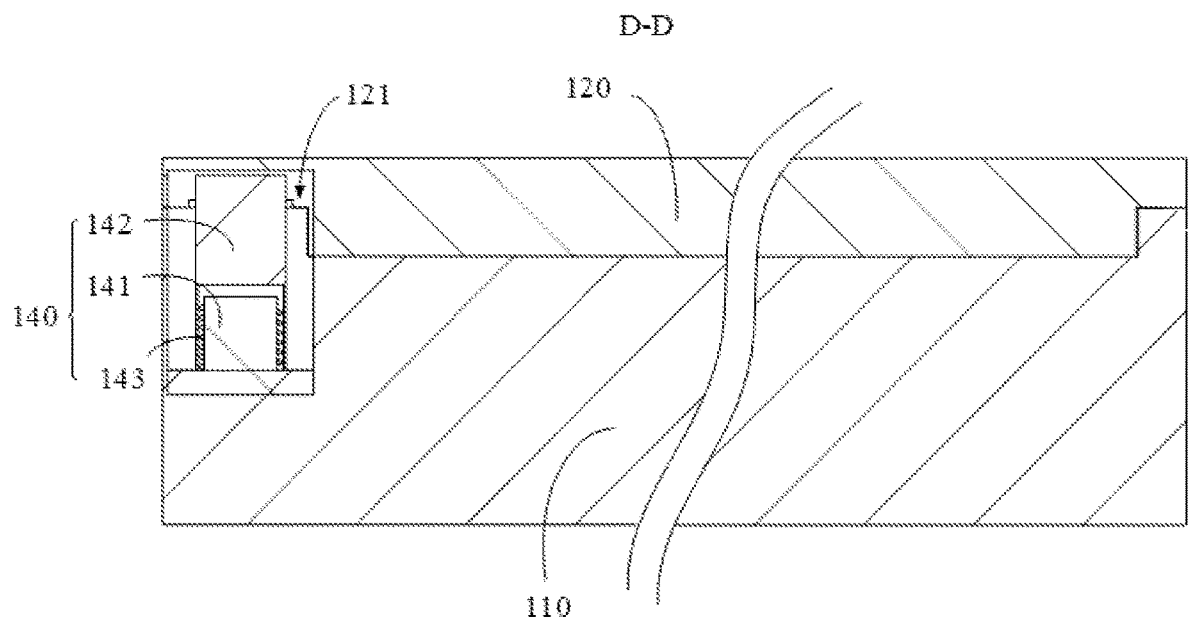
FIG. 6 is a sectional view of D-D place in FIG. 5.
Figure 7:
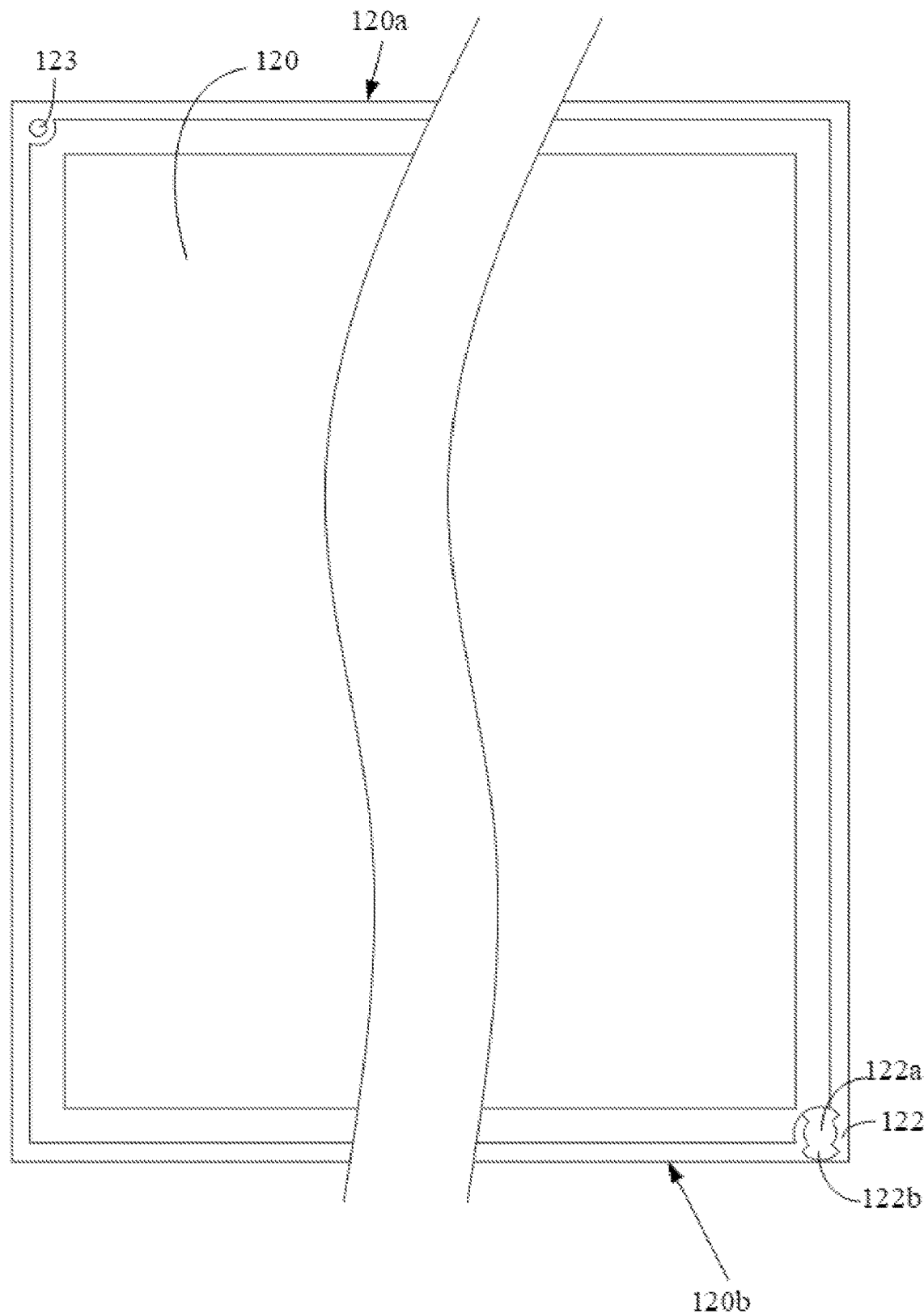
FIG. 7 is a bottom view of an upper frame in a backplane assembly according to a first embodiment of the present application.
Figure 8:
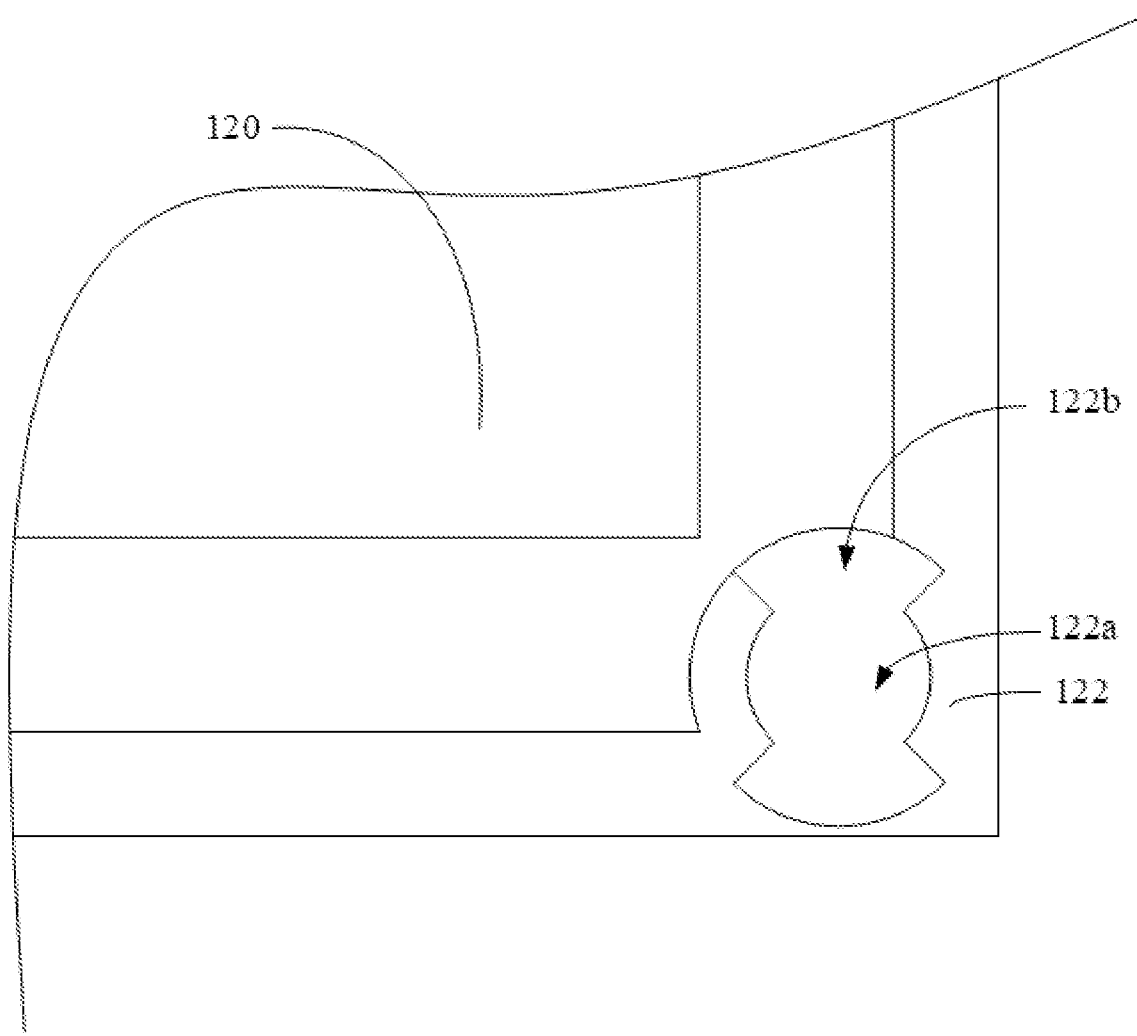
FIG. 8 is a partial view at the lower right corner in FIG. 7.
Figure 9:
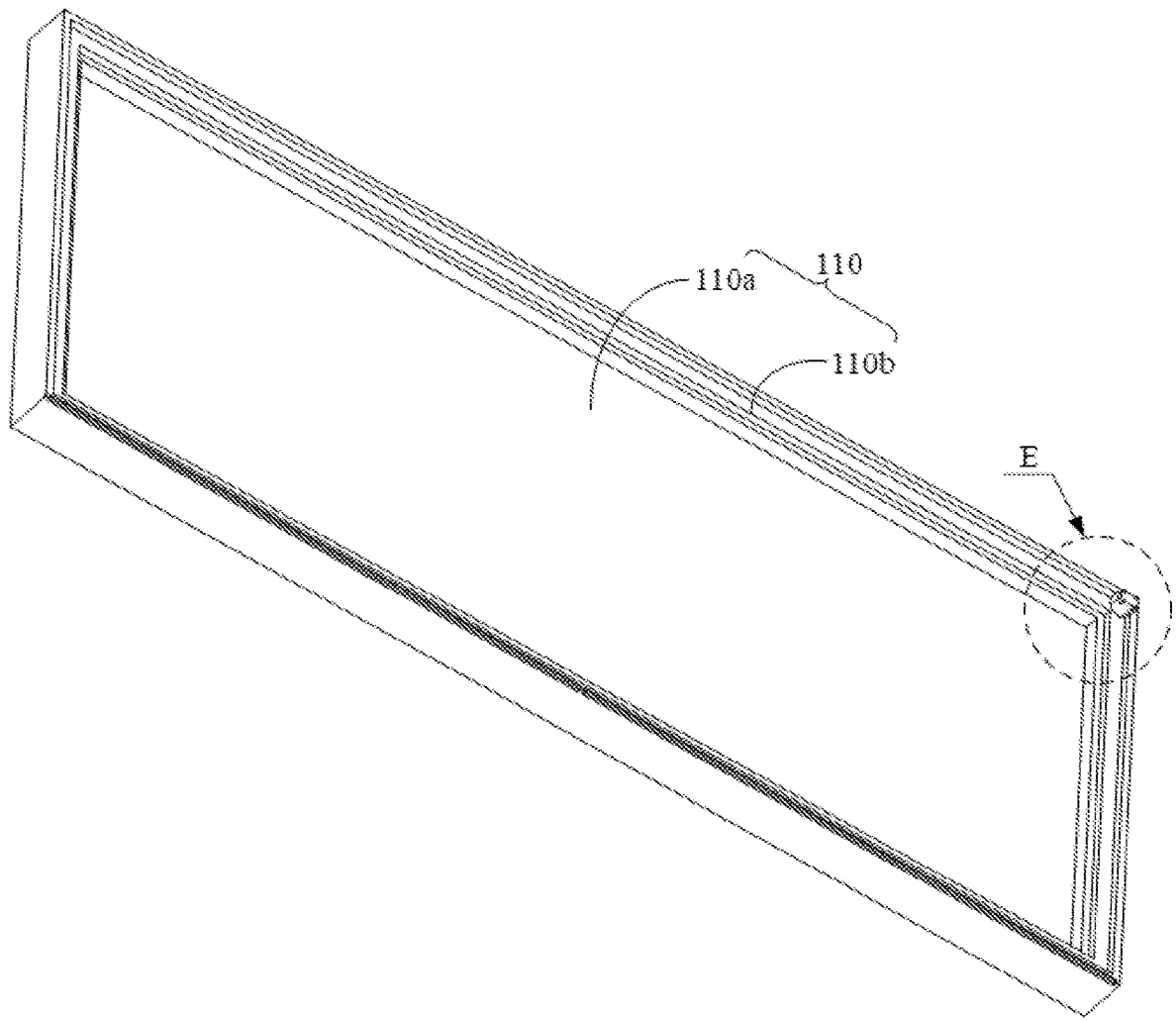
FIG. 9 is a structural schematic view of a backplane assembly after the upper frame is removed according to a first embodiment of the present application.
Figure 10:
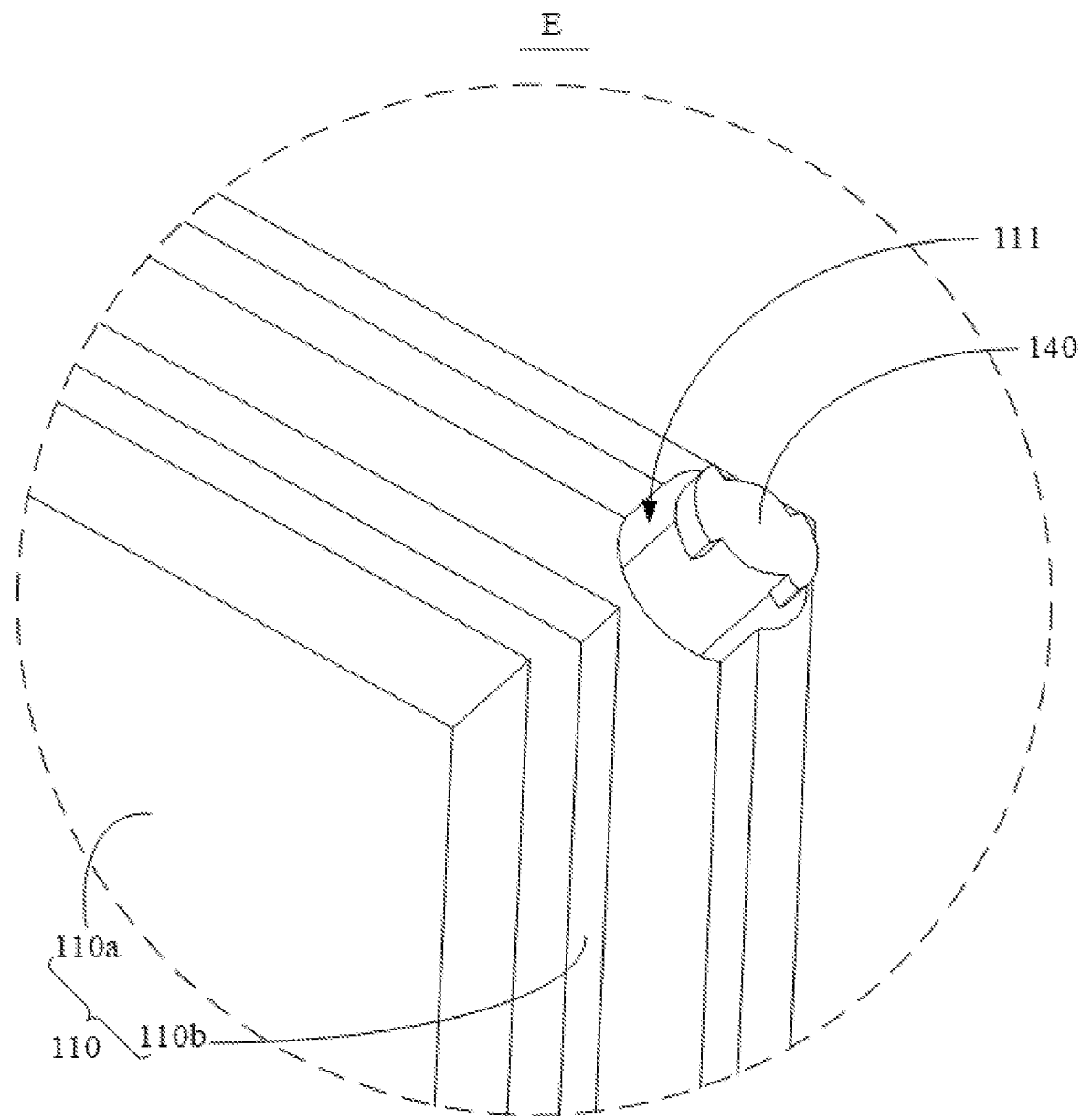
FIG. 10 is a partial enlarged view at E place in FIG. 9.
Figure 11:
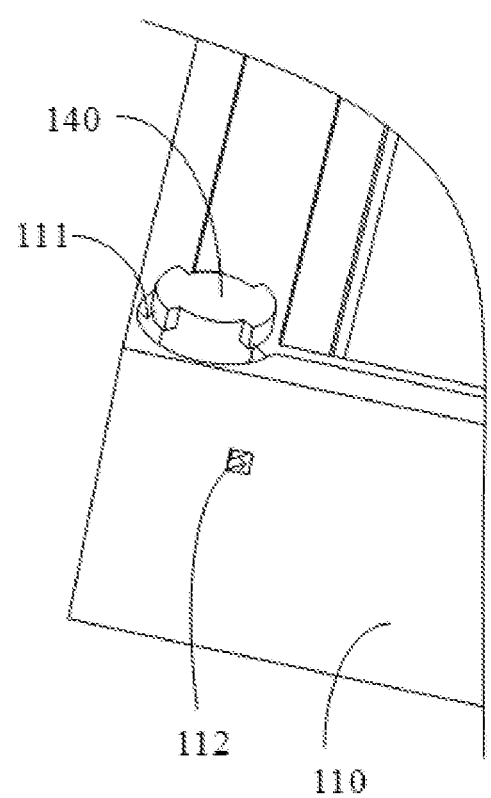
FIG. 11 is a structural schematic view of another angle of view after the bottom backplane and the locking assembly are assembled in the backplane assembly according to a first embodiment of the present application.
Figure 12:
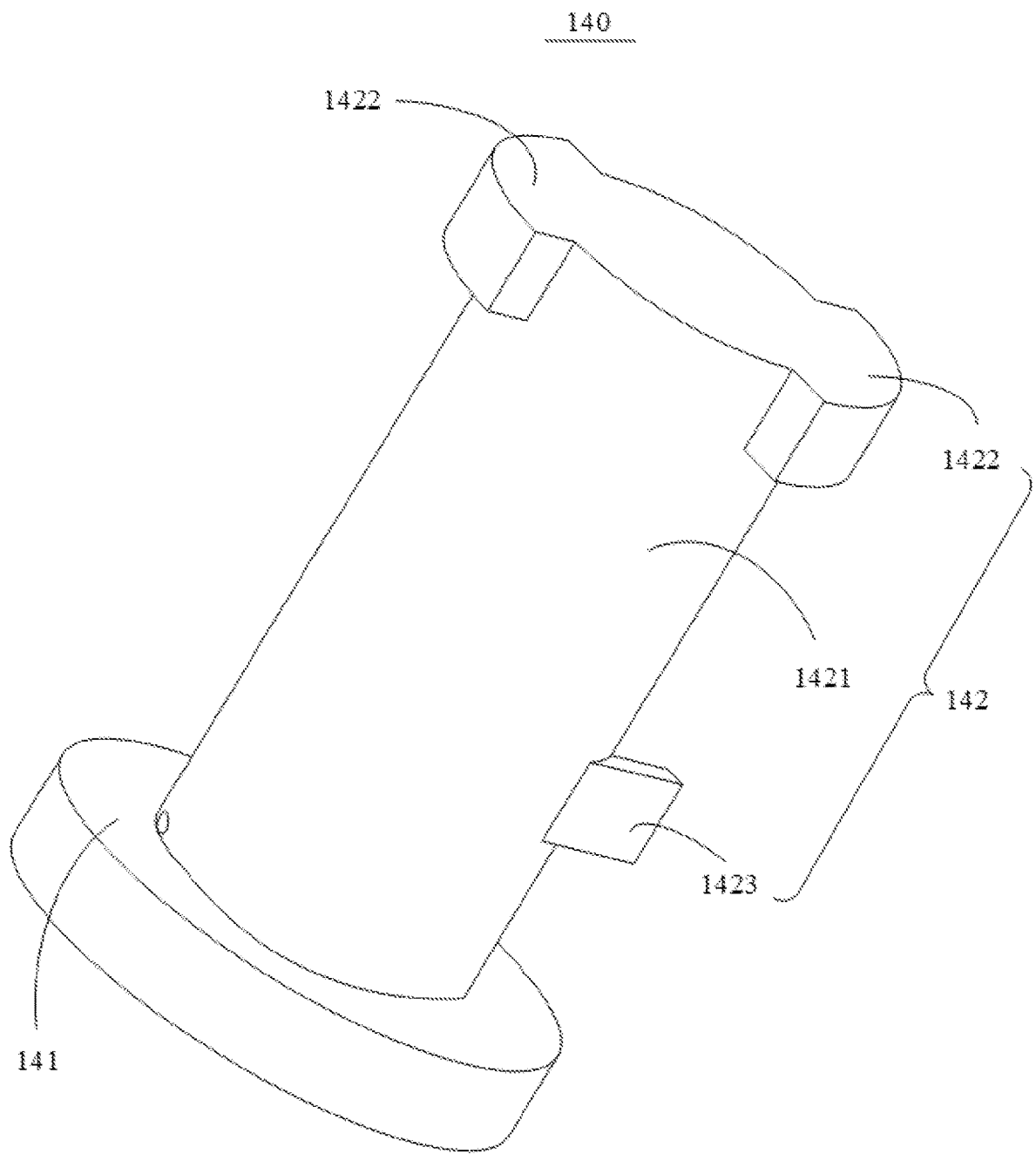
FIG. 12 is a three-dimensional structural schematic view of a locking assembly in a backplane assembly according to a first embodiment of the present application.
Figure 13:
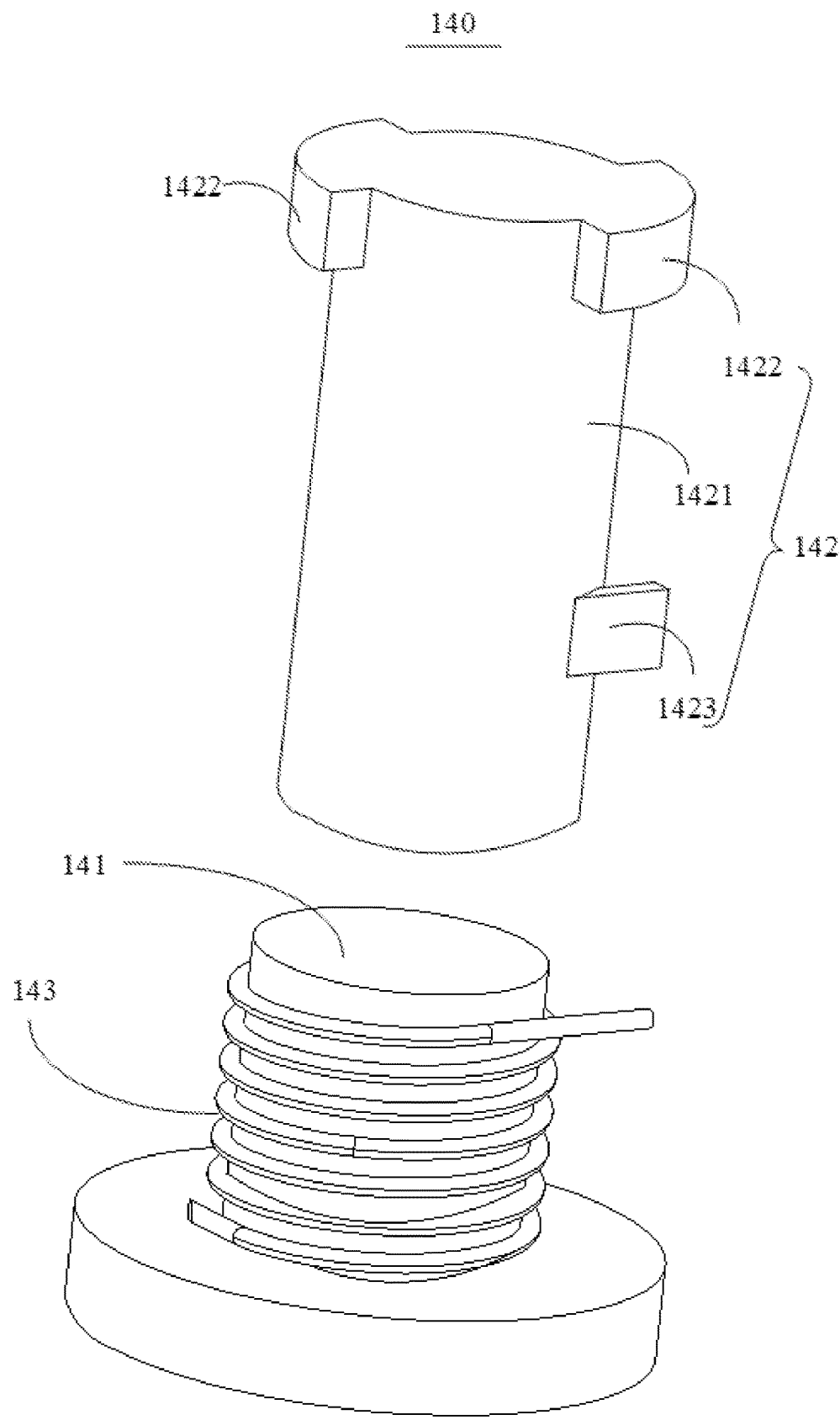
FIG. 13 is a schematic view of an exploded structure of a locking assembly in a backplane assembly according to a first embodiment of the present application.

Further, please referring to FIG. 1, FIG. 4 and FIG. 13, the locking assembly 140 also includes a first torsion spring 143, which is sleeved outside the fixing post 141. One end of the first torsion spring 143 is connected to the fixing post 141, and the other end is connected to the sleeve 142.

The first torsion spring 143 is sleeved outside the fixing post 141. One end of the first torsion spring 143 is connected to the fixing post 141, and the other end is connected to the sleeve 142, so that the sleeve 142 will drive the first torsion spring 143 to deform during rotation. When the user no longer drives the sleeve 142 to rotate, the sleeve 142 will return to the initial position under the elastic force of the first torsion spring 143. For example, when the initial position of the sleeve 142 is that the limiting block 1422 on the sleeve 142 is set opposite to the limiting plate 122 of the upper frame 120, after the user drives the sleeve 142 to rotate a certain angle, the first torsion spring 143 elastically deforms, and the limiting block 1422 on the sleeve 142 is misaligned with the limiting plate 122 of the upper frame 120; when the user removes the driving force on the sleeve 142, the resilient force of the first torsion spring 143 drives the sleeve 142 back to the initial position, so that the limiting block 1422 on the sleeve 142 is arranged opposite to the limiting plate 122 of the upper frame 120 again.

Such arrangement makes it convenient for the user to first drive the sleeve 142 to rotate at a certain angle, and then move the upper frame 120 toward the bottom backplane 110 before installing the upper frame 120 on the bottom backplane 110. At this time, the limiting plate 122 of the upper frame 120 and the limiting block 1422 on the sleeve 142 are misaligned, so that the top of the sleeve 142 and the limiting block 1422 can be inserted into the limiting cavity 121 of the upper frame 120. Then the user releases the sleeve 142, and the sleeve 142 rotates at a certain angle under the elastic force of the first torsion spring 143, so that the sleeve 142 returns to the initial position. At this time, the limiting block 1422 on the sleeve 142 is rotated to the side of the limiting plate 122 of the upper frame 120 away from the bottom backplane 110 to achieve the effect of automatic locking.

Further, please referring to FIG. 5, FIG. 9 to FIG. 13, the bottom backplane 110 also has a side wall 110b connected to the bottom wall 110a, and the side wall 110b is provided with a mounting groove 111 and an avoidance hole 112. The mounting groove 111 has an opening facing the upper frame 120, and the fixing post 141, the sleeve 142 and the limiting block 1422 are all located in the mounting groove 111. One end of the avoidance hole 112 is connected to the mounting groove 111, and the other end passes through the side wall 110b to communicate with the outside world. A drive block 1423 protrudes from the outer wall of the cylinder body 1421, and the drive block 1423 is exposed through the avoidance hole 112.

By setting the fixing post 141, the sleeve 142 and the limiting block 1422 in the mounting groove 111, the risk of the fixing post 141, the sleeve 142, and the limiting block 1422 being exposed to the outside can be reduced, the erosion of the locking assembly 140 by dust, water, etc can be reduced, and a longer service life of the locking assembly 140 can be ensured. In addition, by disposing the fixing post 141, the sleeve 142 and the limiting block 1422 in the mounting groove 111, the space occupied by the backplane assembly 100 as a whole can be reduced.

Furthermore, the bottom backplane 110 is also provided with an avoidance hole 112 communicating with the mounting groove 111, and the avoidance hole passes through the side wall 110b to communicate with the outside world. The outer wall of the cylinder body 1421 is protruded with a drive block 1423, and the drive block 1423 is exposed through the avoidance hole 112, which is convenient for the user to use a rod-shaped tool to pass through the avoidance hole 112 to resist the drive block 1423, so as to realize the effect of the rotation of the sleeve 142, that is, the user can achieve the effect of rotating the sleeve 142 only by pressing. In addition, the drive block 1423 does not pass through the avoidance hole 112 and protrudes to the outside, which can reduce the risk of the user easily touching the drive block 1423 to rotate the sleeve 142 in an accidental situation.

Of course, in other embodiments, a driving rod can also protrude from the drive block 1423 toward the avoidance hole 112, and the driving rod can pass through the avoidance hole 112 to extend to the outside, so that the user can drive the sleeve 142 by pressing the driving rod, thereby preventing the user from driving the sleeve 142 to rotate by means of a tool.

Second Embodiment

Figure 14:
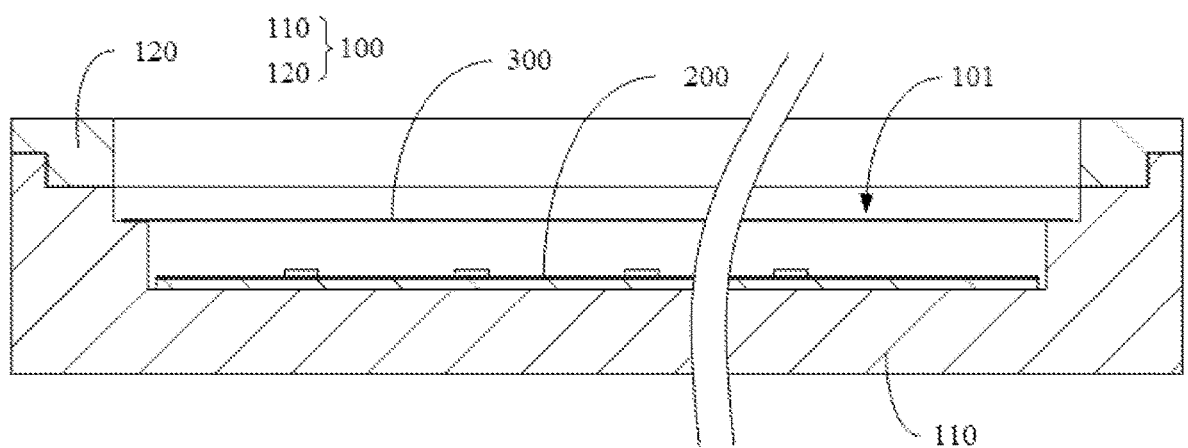
FIG. 14 is a cross-sectional view of a backlight module according to a second embodiment of the present application.

The present application also provides a backlight module. As shown in FIG. 14, the backlight module includes a light board 200, an optical film 300 and a backplane assembly 100, and the backplane assembly 100 adopts the specific structure of the above-mentioned backplane assembly 100. Since the backlight module includes all the technical solutions of the above-mentioned embodiments, it at least has all the beneficial effects brought by the technical solutions of the above-mentioned embodiments, and will not be repeated here. The bottom backplane 110 is formed with an accommodating cavity 101, and the light board 200 and the optical film 300 are arranged in the accommodating cavity 101.

By arranging both the light board 200 and the optical film 300 in the accommodating cavity 101, on the one hand, it can have a better protection effect on the light board 200 and the optical film 300, and on the other hand, the optical film 300 can be exposed when the upper frame 120 rotates relative to the bottom backplane 110. Furthermore, the user only needs to remove the optical film 300 to expose the light board 200 for maintenance or disassembly of the light board 200. Furthermore, if the optical film 300 is placed in the accommodating cavity 101 of the bottom backplane 110, it is possible to avoid setting the mounting structure for installing the optical film 300 and the limiting structure for preventing the optical film 300 from falling on the upper frame 120. Only support steps need to be provided on the bottom backplane 110 to meet the installation requirements for the optical film 300, without requiring more complicated structures.

Third Embodiment

Figure 15:
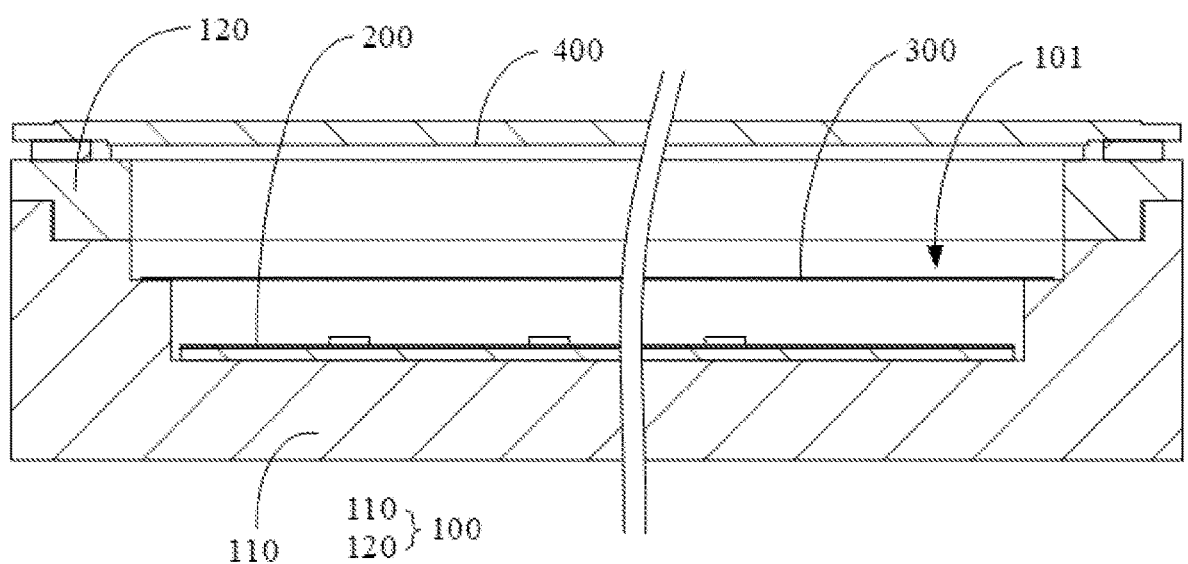
FIG. 15 is a cross-sectional view of a display according to a third embodiment of the present application.

The present application also provides a display. As shown in FIG. 15, the display includes a display panel 400 and a backlight module, and the backlight module adopts the specific structure of the above-mentioned backlight module. Since the display includes all the technical solutions of all the above-mentioned embodiments, it at least has all the beneficial effects brought by the technical solutions of the above-mentioned embodiments, and will not be repeated here. The display panel 400 is disposed on a side of the upper frame 120 away from the bottom backplane 110.

The backlight module plays the role of providing light from the light source, and the display panel 400 is used to display images. By disposing the display panel 400 on the side of the upper frame 120 away from the bottom backplane 110, that is, the display panel 400 disposed on the light emitting side of the backlight module, the backlight module can provide light for the display panel 400, so that the display panel 400 displays images with a certain brightness for users to watch.

The above are only some embodiments of the present application, and are not intended to limit the scope of the present application. Under the inventive concept of the present application, the equivalent structural transformations made by using the description of the application and the contents of the accompanying drawings, or direct/indirect applications in other relevant technical fields are included in the scope of the present application.

What is claimed is:

1. A backplane assembly, comprising:
 a bottom backplane provided with a bottom wall;
 an upper frame arranged above the bottom backplane; wherein the upper frame is provided with a first side and a second side opposite to the first side, and a connecting line from the first side to the second side is parallel to the bottom wall of the bottom backplane; the first side is provided with a rotating shaft, and the rotating shaft extends toward the bottom backplane;
 a locking assembly movably arranged on the bottom backplane and opposite to the second side; wherein when the locking assembly moves to a first position, the locking assembly is mutually locked with the second side of the upper frame, so that the upper frame and the bottom backplane are relatively fixed; when the locking assembly moves to a second position, the second side of the upper frame is disengaged from the locking assembly; and
a bearing assembly, comprising:
a bearing body slidably arranged on the bottom backplane and sleeved outside the rotating shaft; and
a first elastic member arranged on the bottom backplane, wherein the first elastic member is configured to elastically support the bearing body away from a side of the upper frame, so as to drive the bearing body to move toward the upper frame.

2. The backplane assembly according to claim 1, wherein one of the bottom backplane and the upper frame is provided with an embedding groove, and the other one of the bottom backplane and the upper frame is provided with a protrusion; the protrusion is embedded in the embedding groove.

3. The backplane assembly according to claim 1, wherein the bottom backplane is further provided with a side wall connected to the bottom wall, and the side wall is provided with an accommodating groove opening toward the upper frame; the bearing assembly also comprises a guide post, and the first elastic member is sleeved outside the guide post; the bearing body, the first elastic member and the guide post are arranged in the accommodating groove.

4. The backplane assembly according to claim 3, wherein the bearing assembly further comprises:
a second elastic member; wherein one end of the second elastic member is connected to the outer wall of the bearing body, and the other end extends away from the axis of the bearing body; and
a limiting post; wherein the limiting post is connected to one end of the second elastic member away from the bearing body; a groove wall of the accommodating groove is provided with a limiting hole, and the limiting post extends into the limiting hole; the limiting hole passes through the side wall of the bottom backplane.

5. The backplane assembly according to claim 3, wherein the bearing assembly further comprises a rotation stopper, and the rotation stopper is protruded on an outer side wall of the bearing body; the groove wall of the accommodating groove is correspondingly provided with an avoidance groove, and the rotation stopper is inserted into the avoidance groove.

6. The backplane assembly according to claim 1, wherein the locking assembly comprises:
a fixing post fixedly installed on the bottom backplane; and
a sleeve; wherein the sleeve comprises a cylinder body and a limiting block, and the cylinder body is rotatably sleeved outside the fixing post; the limiting block is protruded on an outer side wall of the cylinder body;
wherein the upper frame is provided with a limiting cavity, and a limiting plate is provided on a side of the limiting cavity close to the bottom backplane; the limiting block abuts against a side of the limiting plate away from the bottom backplane, and the limiting plate is provided with a piercing opening and an avoidance opening communicating with each other; the cylinder body is passed through the piercing opening; the avoidance opening is configured for fully exposing the limiting block when the sleeve is rotated to the second position.

7. The backplane assembly according to claim 6, wherein the locking assembly further comprises a first torsion spring, and the first torsion spring is sleeved outside the fixing post; one end of the first torsion spring is connected to the fixing post, and the other end of the first torsion spring is connected to the sleeve.

8. The backplane assembly according to claim 6, wherein the bottom backplane is also provided with a side wall connected to the bottom wall, and the side wall is provided with a mounting groove and an avoidance hole; the mounting groove is provided with an opening facing the upper frame, and the fixing post, the sleeve and the limiting block are all located in the mounting groove; one end of the avoidance hole communicates with the mounting groove, and the other end of the avoidance hole passes through the side wall to communicate with an outside world; a drive block is protruded from the outer side wall of the cylinder body, and the drive block is exposed through the avoidance hole.

9. A backlight module, comprising:
a light board;
an optical film; and
a backplane assembly, comprising:
a bottom backplane provided with a bottom wall;
an upper frame arranged above the bottom backplane; wherein the upper frame is provided with a first side and a second side opposite to the first side, and a connecting line from the first side to the second side is parallel to the bottom wall of the bottom backplane; the first side is provided with a rotating shaft, and the rotating shaft extends toward the bottom backplane;
a locking assembly movably arranged on the bottom backplane and opposite to the second side; wherein when the locking assembly moves to a first position, the locking assembly is mutually locked with the second side of the upper frame, so that the upper frame and the bottom backplane are relatively fixed; when the locking assembly moves to a second position, the second side of the upper frame is disengaged from the locking assembly; and
a bearing assembly, comprising:
a bearing body slidably arranged on the bottom backplane and sleeved outside the rotating shaft; and
a first elastic member arranged on the bottom backplane, wherein the first elastic member is configured to elastically support the bearing body away from a side of the upper frame, so as to drive the bearing body to move toward the upper frame;
wherein the bottom backplane is formed with a receiving cavity, and the light board and the optical film are arranged in the receiving cavity.

10. A display, comprising:
a display panel; and
a backlight module, comprising:
a light board;
an optical film; and
a backplane assembly, comprising:
a bottom backplane provided with a bottom wall;
an upper frame arranged above the bottom backplane; wherein the upper frame is provided with a first side and a second side opposite to the first side, and a connecting line from the first side to the second side is parallel to the bottom wall of the bottom backplane; the first side is provided with a rotating shaft, and the rotating shaft extends toward the bottom backplane;
a locking assembly movably arranged on the bottom backplane and opposite to the second side; wherein when the locking assembly moves to a first position, the locking assembly is mutually locked with the second side of the upper frame, so that the upper frame and the bottom backplane are relatively fixed; when the locking assembly moves to a second position, the second side of the upper frame is disengaged from the locking assembly; and a bearing assembly, comprising:

a bearing body slidably arranged on the bottom backplane and sleeved outside the rotating shaft; and a first elastic member arranged on the bottom backplane, wherein the first elastic member is configured to elastically support the bearing body away from a side of the upper frame, so as to drive the bearing body to move toward the upper frame;

wherein the bottom backplane is formed with a receiving cavity, and the light board and the optical film are arranged in the receiving cavity;

wherein the display panel is arranged on a side of the upper frame away from the bottom backplane.

* * * * *